(12) United States Patent
DiBene, II et al.

(10) Patent No.: US 9,829,948 B2
(45) Date of Patent: Nov. 28, 2017

(54) CURRENT AND INPUT VOLTAGE SENSE CIRCUIT FOR INDIRECTLY MEASURING REGULATOR CURRENT

(71) Applicant: Apple Inc., Cupertino, CA (US)

(72) Inventors: Joseph T. DiBene, II, Santa Cruz, CA (US); Jafar Savoj, Sunnyvale, CA (US); Inder M. Sodhi, Palo Alto, CA (US); Cyril de la Cropte de Chanterac, San Francisco, CA (US); Sotirios Zogopoulos, Los Altos, CA (US)

(73) Assignee: Apple Inc., Cupertino, CA (US)

( * ) Notice: Subject to any disclaimer, the term of this patent is extended or adjusted under 35 U.S.C. 154(b) by 220 days.

(21) Appl. No.: 14/858,035

(22) Filed: Sep. 18, 2015

(65) Prior Publication Data

US 2017/0083069 A1  Mar. 23, 2017

(51) Int. Cl.
| | | |
|---|---|---|
| *G06F 1/00* | (2006.01) | |
| *G06F 11/30* | (2006.01) | |
| *G06F 1/28* | (2006.01) | |
| *G01R 19/255* | (2006.01) | |
| *G01R 19/25* | (2006.01) | |
| *G06F 1/26* | (2006.01) | |

(52) U.S. Cl.
CPC .............. *G06F 1/28* (2013.01); *G01R 19/255* (2013.01); *G01R 19/2506* (2013.01); *G06F 1/263* (2013.01)

(58) Field of Classification Search
None
See application file for complete search history.

(56) References Cited

U.S. PATENT DOCUMENTS

| | | | | |
|---|---|---|---|---|
| 4,356,553 A | * | 10/1982 | Steinle | G01R 21/127 324/77.11 |
| 7,750,614 B2 | * | 7/2010 | Komiya | H02M 3/1563 323/223 |
| 8,638,572 B2 | | 1/2014 | Djenguerian | |
| 8,796,950 B2 | | 8/2014 | Angeles | |
| 9,369,040 B1 | * | 6/2016 | Dosluoglu | H02M 3/158 |
| 2010/0079081 A1 | * | 4/2010 | Zhang | H05B 33/0851 315/291 |
| 2014/0125304 A1 | * | 5/2014 | Wiethege | H02M 3/1563 323/282 |
| 2016/0149511 A1 | * | 5/2016 | Herfurth | H02M 1/4208 363/89 |
| 2016/0336857 A1 | * | 11/2016 | Liu | H02M 3/1588 |

* cited by examiner

*Primary Examiner* — Nitin Patel
(74) *Attorney, Agent, or Firm* — Meyertons, Hood, Kivlin, Kowert & Goetzel, P.C.

(57) ABSTRACT

An apparatus for determining an average current through an inductor of a regulator circuit is disclosed. A counter unit may be configured to receive a control signal, which includes a plurality of pulses, from a Power Management Unit (PMU), and determine a number of pulses received during a predetermined period of time. A pulse sampler unit may determine a duration of a given pulse of the plurality of pulses. Circuitry may be configured to determine the average current through the inductor during the predetermined period of time dependent upon the number of pulses received during the predetermined period of time and the duration of the given pulse.

18 Claims, 7 Drawing Sheets

CURRENT AND INPUT VOLTAGE SENSE CIRCUIT FOR INDIRECTLY MEASURING REGULATOR CURRENT

BACKGROUND

Technical Field

Embodiments described herein are related to the field of voltage regulation for integrated circuits, and more particularly to the measurement of voltage regulator current.

Description of the Related Art

Computing systems may include multiple integrated circuits, each of which may include different circuits, such as, a radio frequency transceiver, for example. Such integrated circuits may employ different power supply voltage levels to perform their respective functions. Computing systems may employ one or more voltage regulator units to generate the needed power supply voltage levels.

Each voltage regulator unit may employ a combination of active and passive circuit elements to generate a desired voltage level from a reference voltage level. In some computing systems, such as, cellular telephones or table computers, a rechargeable battery may provide the reference voltage. In other computing system, the reference voltage level may be generated from an alternating current (AC) line voltage level.

Some computing systems may include a system-on-a-chip (SoC) which may integrate different functional units into a single integrated circuit. Each functional unit may employ a different power supply voltage level. In such cases, a Power Management Unit (PMU) may be used in conjunction with multiple voltage regulator units to generate the desired power supply voltage levels for the SoC, as well as, adjust the power supply voltage levels dependent upon performance or thermal characteristics of the computing system.

SUMMARY OF THE EMBODIMENTS

Various embodiments of a current monitoring unit are disclosed. Broadly speaking, a circuit and a method are contemplated in which a counter unit may be configured to receive a signal from a Power Management Unit (PMU). The signal may include a plurality of pulses, and the counter unit may be further configured to determine a number of pulses received during a predetermined period of time. A pulse sample unit may be configured to receive the signal from the PMU and determine a duration of a given one of the pulses received. Circuitry may be configured to determine a value of an average current flowing through an inductor included in the PMU dependent upon the number of pulses and the duration of the given pulse.

In another embodiment, in order to determine the value of the average current through the inductor, the circuitry may be further configured to multiply a value of a power supply coupled to the PMU by an intermediate value. The intermediate value may be dependent upon the duration of the given pulse, and at least one constant.

In another non-limiting embodiment, the at least one constant includes a constant of proportionality between a first value of current through the inductor and the value of the power supply coupled to the PMU. In a further embodiment, the circuitry may be further configured to determine a value of the at least one constant during a calibration mode.

BRIEF DESCRIPTION OF THE DRAWINGS

The following detailed description makes reference to the accompanying drawings, which are now briefly described.

Figure 1:
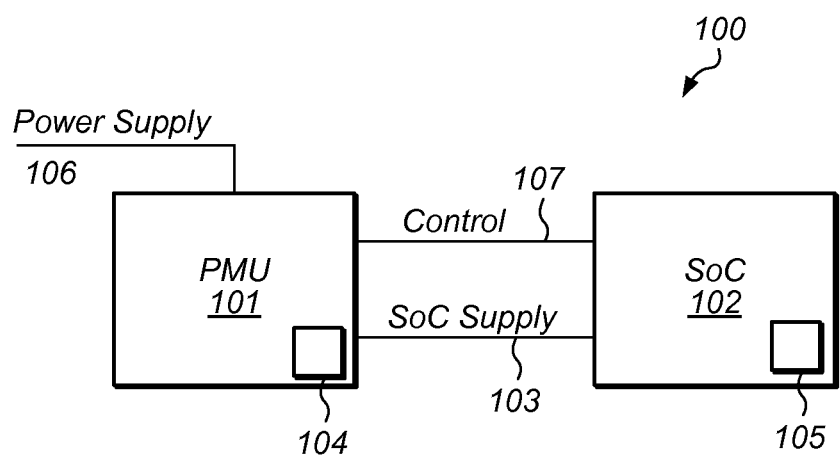
FIG. 1 illustrates an embodiment of a computing system.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph (f) interpretation for that unit/circuit/component. More generally, the recitation of any element is expressly intended not to invoke 35 U.S.C. §112, paragraph (f) interpretation for that element unless the language "means for" or "step for" is specifically recited.

DETAILED DESCRIPTION OF EMBODIMENTS

A system on a chip (SoC) may include one or more functional units, such as, e.g., a processor, which may integrate the function of a computing system onto a single integrated circuit. Some functional units may be designed using a full-custom design methodology, while other functional units may be implemented using logic synthesis and place-and-route. Depending on their respective intended function, each functional unit may be designed to operate at different clock frequencies and different power supply voltage levels.

To accommodate the different power supply voltage levels, SoCs may include a power management unit (PMU) that may generate the desired power supply voltage levels using voltage regulators or other suitable circuits, such as, a buck regulator, for example. In some applications, it may be desirable to detect an amount of current supplied by a voltage regulator to a particular load. Adjustments to performance parameters, such as, e.g., clock frequency, may be made dependent upon the detected current.

Determining the amount of current may involve the use of a sense resistor or other suitable resistive device in series with the output the voltage regulator, across which, a voltage may be measured. Based on the measured voltage, the current may be determined. Method such as this may consume DC power and employ complex analog circuitry. The embodiments illustrated in the drawings and described below may provide techniques to measure an average current output from a voltage regulator while limiting power consumption and circuit complexity.

An embodiment of a computing system is illustrated in FIG. 1. In the illustrated embodiment, computing system 100 includes PMU 101 and SoC 102. In various embodiments, PMU 101 and SoC 102 may be fabricated on a single integrated circuit using a semiconductor manufacturing process. Alternatively, PMU 101 and SoC 102 may be fabricated on separate integrated circuits and mounted together on a single circuit board or other suitable substrate. In some embodiments, PMU 101 and SoC 102 may be mounted in a common integrated circuit package. Although a single SoC is depicted in the embodiment of FIG. 1, it is noted that, in other embodiments, any suitable number of SoCs may be employed.

Power supply 106 is coupled to PMU 101 which, in turn, is coupled to control signal 107 and SoC supply signal 103. In various embodiments, PMU 101 includes voltage regulator 104, which may be configured to generate a desired voltage level on SoC supply 103. It is noted that although only a single voltage regulator and SoC supply signal are depicted in the embodiment illustrated in FIG. 1, in other embodiments, any suitable number of voltage regulators and SoC supply signals may be employed.

In the present embodiment, a power terminal of SoC 102 is coupled to SoC supply signal 103. Additionally, SoC 102 is configured to receive control signal 107 from PMU 101. As described below in more detail, SoC 102 may include multiple functional units, including pulse analysis unit 105. In various embodiments, pulse analysis unit 105 may be configured to analyze control signal 107 and use results from the analysis to determine an average current flowing through SoC supply signal 103.

During operation, voltage regulator 104 may generate a desired voltage level on SoC supply signal 103 dependent upon a voltage level of power supply 106. In some embodiments, voltage regulator may be a type of switched regulator where power supply 106 may be periodically coupled to a load, such as, e.g., SoC 102, through an inductor. A frequency with which power supply 106 is coupled to SoC 102 through the inductor may be determined based on a desired voltage level on SoC supply signal 103. A signal that includes a series of pulses may be used to activate one or more switches that couple power supply 106 to SoC 102 through the inductor. In various embodiments, the signal may be buffered to generate control signal 107, which is transmitted to SoC 102.

Pulse analysis unit 105 may, in various embodiments, determine a number of pulses on control signal 107 during a predetermined period of time. In various embodiments, the period of time may be programmable. A register (not shown) may store a value indicative of the predetermined period of time. The value stored in the register may be updated by one or more program instructions executed by SoC 102. Pulse analysis unit 105 may also determine a duration of a given pulse included on control signal 107. In various embodiments, pulse analysis unit 105 may employ the number of pulses detected during the predetermined period of time and the duration of a given pulse to determine an average current flowing through SoC 102 during the predetermined period of time. In various embodiment, by employing the number of pulses detected and the pulse duration, pulse analysis unit 105 may determine the average current without the use of analog detection circuits and a power consumption associated with such circuits.

It is noted that the embodiment illustrated in FIG. 1 is merely an example. In other embodiments, different numbers of components and different configurations of the components are possible and contemplated.

Figure 2:
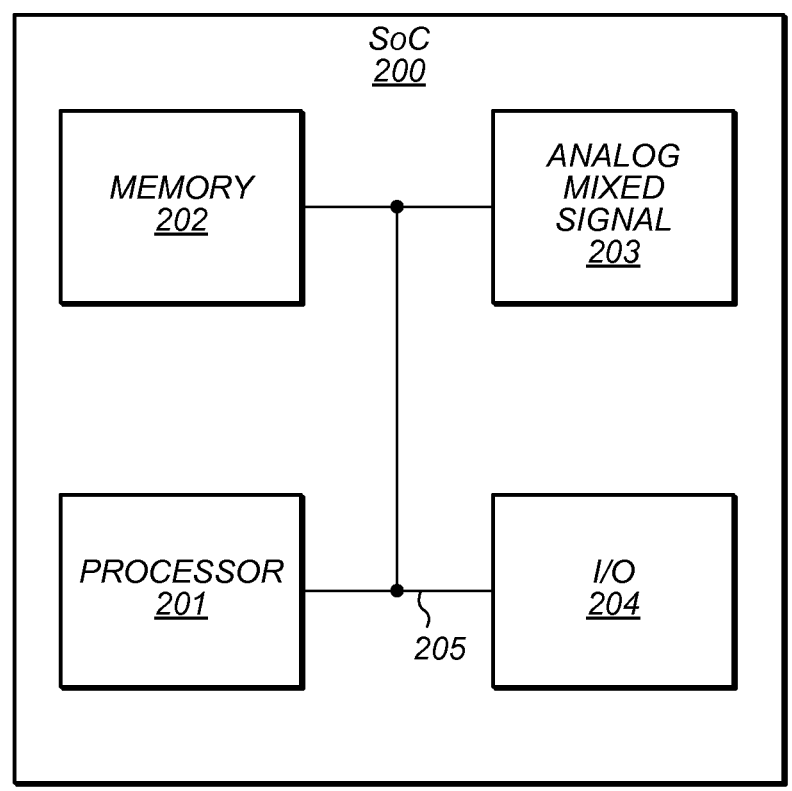
FIG. 2 illustrates an embodiment of system-on-a-chip.

Turning to FIG. 2, a block diagram of an SoC is illustrated. In some embodiments, SoC 200 may correspond to SoC 102 shown in FIG. 1. In the illustrated embodiment, the SoC 200 includes a processor 201 coupled to memory block 202, and analog/mixed-signal block 203, and I/O block 204 through internal bus 205. In various embodiments, SoC 200 may be configured for use in a mobile computing application such as, e.g., a tablet computer or cellular telephone.

Processor 201 may, in various embodiments, be representative of a general-purpose processor that performs computational operations. For example, processor 201 may be a central processing unit (CPU) such as a microprocessor, a microcontroller, an application-specific integrated circuit (ASIC), or a field-programmable gate array (FPGA). In some embodiments, processor 201 may include one or more register files and memories. Processor 201 may also be a computing complex having one or more processors or processor cores therein.

In some embodiments, processor 201 may implement any suitable instruction set architecture (ISA), such as, e.g., the PowerPC™, ARM™ or x86 ISAs, or combination thereof. Processor 201 may include one or more bus transceiver units that allow processor 201 to communication to other functional blocks within SoC 200 such as, memory block 202, for example.

Memory block 202 may include any suitable type of memory such as a Dynamic Random Access Memory (DRAM), a Static Random Access Memory (SRAM), a Read-only Memory (ROM), Electrically Erasable Programmable Read-only Memory (EEPROM), a FLASH memory, or a Ferroelectric Random Access Memory (FeRAM), for example. In some embodiments, memory block 202 may be configured to store program code or program instructions that may be executed by processor 201. Memory block 202 may, in other embodiments, be configured to store data to be processed, such as graphics data, for example.

It is noted that in the embodiment of an SoC illustrated in FIG. 2, a single memory block is depicted. In other embodiments, any suitable number of memory blocks and memory types may be employed.

Analog/mixed-signal block 203 may include a variety of circuits including, for example, a crystal oscillator, a phase-locked loop (PLL) or delay-locked loop (DLL), an analog-to-digital converter (ADC), and a digital-to-analog converter (DAC) (all not shown). In other embodiments, analog/mixed-signal block 203 may be configured to perform power management tasks with the inclusion of on-chip power supplies, voltage regulators, and clock frequency scaling circuitry. Analog/mixed-signal block 203 may also include, in some embodiments, radio frequency (RF) circuits that may be configured for operation with cellular telephone networks.

I/O block 204 may be configured to coordinate data transfer between SoC 200 and one or more peripheral devices. Such peripheral devices may include, without limitation, storage devices (e.g., magnetic or optical media-based storage devices including hard drives, tape drives, CD drives, DVD drives, etc.), audio processing subsystems, graphics processing subsystems, or any other suitable type of peripheral devices. In some embodiments, I/O block 104 may be configured to implement a version of Universal Serial Bus (USB) protocol or IEEE 1394 (Firewire®) protocol, and may allow for program code and/or program instructions to be transferred from a peripheral storage device for execution by processor 201.

I/O block 204 may also be configured to coordinate data transfer between SoC 200 and one or more devices (e.g., other computer systems or SoCs) coupled to SoC 200 via a network. In one embodiment, I/O block 204 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, I/O block 204 may be configured to implement multiple discrete network interface ports.

It is noted that the SoC illustrated in FIG. 2 is merely an example. In other embodiments, different functional blocks and different configurations of functions blocks may be possible dependent upon the specific application for which the SoC is intended. It is further noted that the various functional blocks illustrated in SoC 200 may operate at different clock frequencies, and may require different power supply voltages.

Figure 3:
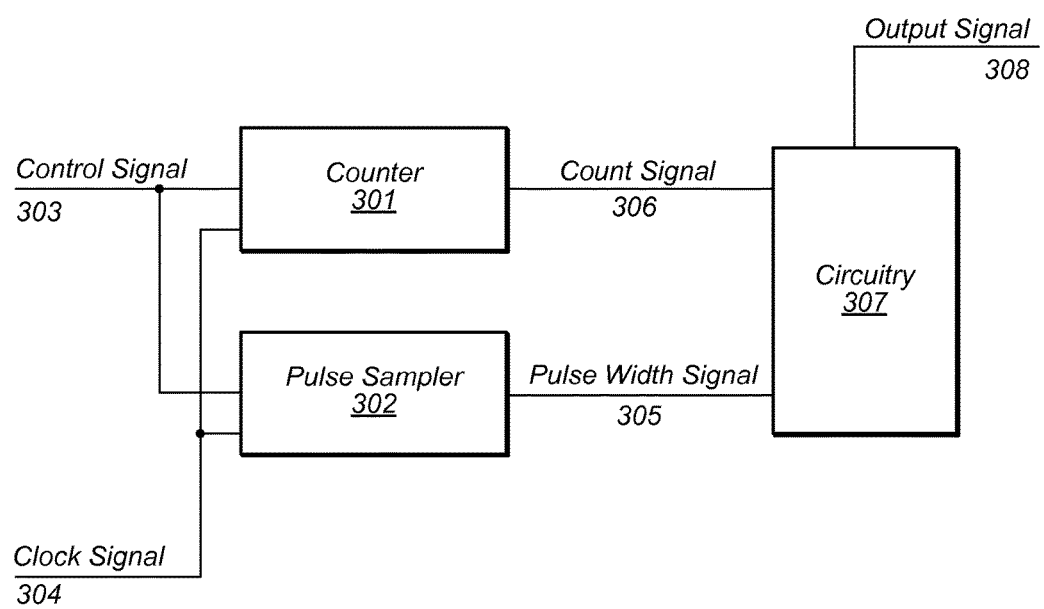
FIG. 3 illustrates an embodiment of a pulse analysis unit.

Turing to FIG. 3, a block diagram of an embodiment of a pulse analysis unit is illustrated. In various embodiments, pulse analysis unit 300 may correspond to pulse analysis unit 105 as depicted in FIG. 1. In the illustrated embodiment, pulse analysis unit 300 includes counter 301, pulse sampler 302, and circuitry 307. Both counter 301, and pulse sampler 302 are coupled to control signal 303. It is noted that in various embodiments, control signal 303 may correspond to control signal 107 of computing system 100 as illustrated in FIG. 1.

Counter 301 may be configured to determine a number of pulses that occur on control signal 301 within a predetermined period of time. In various embodiments, the predetermined period of time may be determined dependent upon clock signal 304. For example, counter 301 may increment if a pulse exists on control signal 301 when clock signal 304 transitions. After a predetermined number of pulses on clock signal 304 have elapsed, a number of detected pulses on control signal 301 may be encoded on count signal 306. In various embodiments, count signal 306 may include multiple data bits, and the number of detected pulses may be encoded in accordance with any suitable encoding method. It is noted that, in various embodiments, the predetermined period of time may be programmable.

Pulse sampler 302 may, in various embodiments, be configured to determine a width of one or more pulses occurring on control signal 301. In some embodiments, pulse sampler 302 may include multiple delay lines, each of may be configured to provide a respective predetermined amount of delay. A particular pulse occurring on control signal 301 may be applied to each of the multiple delay lines, and the output of each delay line may be used to determine the duration, i.e., width of the particular pulse. In other embodiments, the pulse may be repeatedly sampled dependent upon clock signals 304. The values of the various samples may then be used to determine the duration of the pulse. The width of the pulse may then be encoded on pulse signal width 304. Although depicted as a single wire, in various embodiments, pulse signal width 304 may include multiple data bits, and the determined width of a given pulse on control signal 301 may be encoded using the multiple data in accordance with one of various encoding schemes.

Although the use of delay lines is described above in regard to the operation of pulse sampler 302, it is noted that, in other embodiments, any suitable pulse width detection circuit may be employed.

Circuitry 307 may be configured to determine an average current output from a voltage regulator. As described below in more detail, circuitry 307 may calculate an intermediate value based on the direction of a given pulse. The intermediate value may be used in conjunction with power supply voltage level of voltage regulator to determine the average output current. In some embodiments, circuitry 307 may generate an output signal 306 which may encode a value indicative of the average output current. Such a signal may be used within an SoC or a PMU to adjust one or more performance settings. Circuitry 307 may be designed in accordance with one of various design styles. For example, circuitry 307 may be a dedicated sequential logic circuit, or may be a general-purpose processor configured to execute program instructions to implement the desired calculation.

In some embodiments, count signal 306 and pulse width signal 304 may be transmitted to a processor or other logic circuit. As described below in more detail with regard to FIG. 4 and FIG. 5, the processor or other logic circuit may determine a value of an output current of a voltage regulator, such as, voltage regulator unit 104 as depicted in FIG. 1.

As used herein, a pulse refers to a transition of a signal from a first logic state to a second logic state, and back to the first logic state. A pulse may be a positive pulse, i.e., a period of time where the signal is at a high logic level, or a negative pulse, i.e., a period of time where the signal is at a low logic level.

It is noted that "low" or "low logic level" refers to a voltage at or near ground and that "high" or "high logic level" refers to a voltage level sufficiently large to turn on a n-channel MOSFET and turn off a p-channel MOSFET. In other embodiments, different technology may result in different voltage levels for "low" and "high."

Counters as described herein, may be a sequential logic circuit configured to cycle through a pre-determined set of logic states. A counter may include one or more state elements such as, e.g., flip-flop circuits, and may be designed according to one of various designs styles including asynchronous (ripple counters), synchronous counters, ring counters, and the like.

It is noted that the embodiment depicted in FIG. 3 is merely an example. In other embodiments, different functional units, and different arrangements of functional units may be employed.

Figure 4:
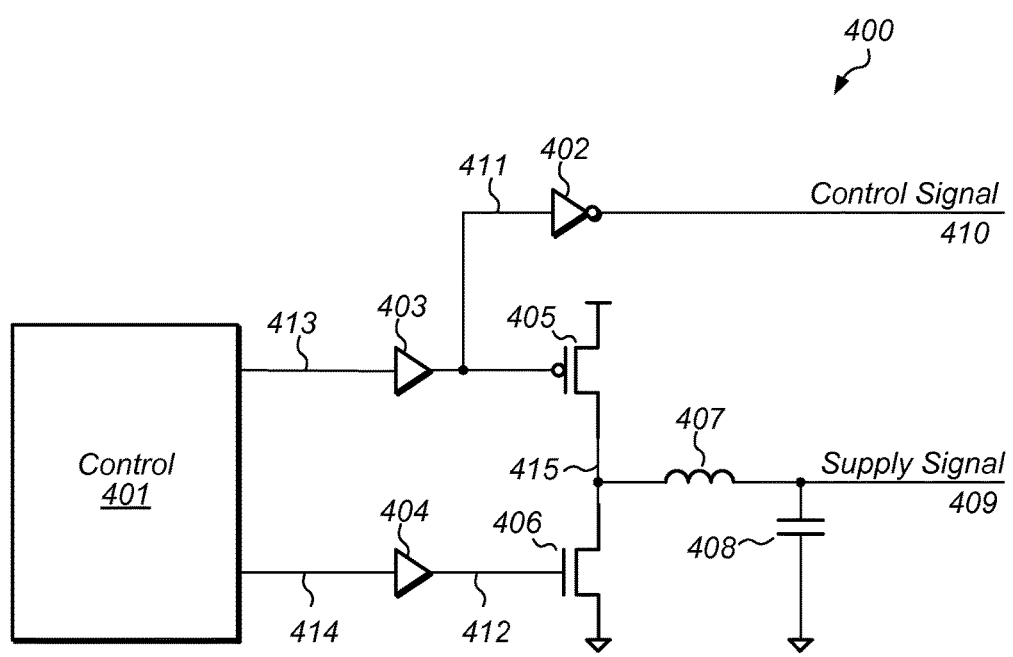
FIG. 4 illustrates an embodiment of a voltage regulator unit.

An embodiment of a voltage regulator unit is illustrated in FIG. 4. In some embodiments, voltage regulator unit 400 may correspond to voltage regulator 104 of computing system 100 as illustrated in FIG. 1. In the illustrated embodiments, voltage regulator unit 400 includes control unit 401, buffers 403 and 404, inverter 402, transistors 405 and 406, inductor 407, and capacitor 408.

Outputs of control unit 401, signals 413 and 414, are coupled to buffers 403 and 404 to generate signals 411 and 412, respectively. Signals 411 and 412 are, in turn, coupled to transistors 405 and 406, respectively. In various embodiments, control unit 401 may assert either signal 411 or 412 in order to activate either transistor 405 or 406, to adjust a voltage level of supply signal 409. For example, if the voltage level of supply signal 409 falls below a predetermined level, control unit 401 may assert control signal 411 to activate transistor 405 in order to source current to supply signal 409, thereby increasing the voltage level of supply signal 409. Alternatively, if the voltage level of supply signal 409 exceeds a predetermined upper threshold level, control unit 401 may assert signal 412 to activate transistor 406, in order to sinking current from supply signal 409, thereby reducing the voltage level of supply signal 409.

During operation, as the voltage level of supply signal 409 changes, each of signals 411 and 412 may include multiple periods where one or the other of the two signals is asserted. Each time one of signals 411 and 412 is asserted and subsequently de-asserted, the resultant period of activity on the signals may be commonly referred to as a pulse.

In some embodiments, control unit 401 may include one or more logic gates and state elements, arranged to implement a desired function for generating signals 413 and 414. Alternatively or additionally, control unit 401 may include a general-purpose processor configured to execute program instructions retrieved from a memory. The execution of the program instructions may implement the desired function for generating signals 413 and 414.

As used and described herein, a buffer may be a particular embodiment of a non-inverting amplifier. In some embodiments, a buffer may include two inverting amplifiers coupled in series. In other embodiments, however, any suitable configured of non-inverting amplifier that provides voltage and/or current gain without changing the logical sense of a signal may used, including non-inverting amplifiers built using technology other than CMOS.

Signal 411 is also coupled to the input of inverter 402, whose output is, in turn, coupled to control signal 410. In various embodiments, control signal 410 may correspond to control signal 107 as depicted in the embodiment illustrated in FIG. 1. Inverter 402 is configured to invert the logical sense of signal 411 to generate control signal 410. It is noted that static complementary metal-oxide semiconductor (CMOS) inverters, such as inverter 402, may be particular embodiments of inverting amplifiers that may be employed in the circuits described herein. In other embodiments, however, any suitable configuration of inverting amplifier that is capable of inverting the logical sense of a signal(s) and performing logical work may be used including inverting amplifiers built using technology other than CMOS.

Transistor 405 is coupled between inductor 407 and a power supply terminal. In various embodiments, the power supply terminal may correspond to a terminal of power supply 106 of computing system 100 as illustrated in FIG. 1. The control terminal of transistor 405 is coupled to signal 411, such that, when signal 411 is asserted, transistor 405 conducts allowing current to from the power supply through inductor 407 to supply signal 409.

Transistor 406 is coupled between inductor 407 and a ground terminal. The control terminal of transistor 406 is coupled to signal 412. When signal 412 is asserted, transistor 405 will conduct and allowing current to discharge from supply signal 409 through inductor 407 to the ground terminal.

Transistor 406 may, in some embodiments, be an n-channel metal-oxide semiconductor field-effect transistor (MOSFET), and transistor 405 may be a p-channel MOSFET. It is noted, however, that in other embodiments, transistors 405 and 406 may be any suitable transconductance device.

Inductor 407 may, in various embodiments, be fabricated on a same integrated circuit as other components in voltage regulator unit 400. In other embodiments, inductor 407 may be a discrete component that is coupled to voltage regulator unit 400 inside a wafer-level package or any other suitable integrated circuit packaging structure. In a similar fashion, capacitor 408 may be fabricated on the same integrated circuit, or included as a discrete component in the wafer-level package or other packaging structure.

It is noted that the embodiment illustrated in FIG. 4 is merely an example. In other embodiments, voltage regulator unit 400 may employ different circuit components and/or different configurations of components.

Figure 5:
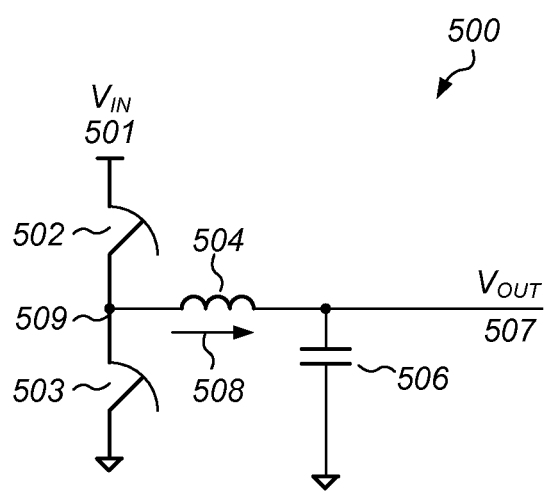
FIG. 5 illustrates a simplified schematic of a voltage regulator unit.

To further understand the operation of a voltage regulator, a simplified circuit schematic, as illustrated in FIG. 5, will now be examined. In various embodiments, the simplified schematic of FIG. 5 may be used to describe the operation of a voltage regulator, such as, voltage regulator 400 as illustrated in FIG. 4. Voltage regulator 500 includes switches 502 and 503, inductor 504, and capacitor 506. In various embodiments, switches 502 and 503 may be implemented as transistors, such as, transistors 405 and 406, as illustrated in FIG. 4.

Switch 502 is coupled to supply voltage $V_{IN}$ 501 and to a first terminal of inductor 504. In various embodiments, $V_{IN}$ 501 may correspond to power supply 106 as illustrated in the embodiment of FIG. 1. The first terminal of inductor 504 is further coupled to switch 503, which is additionally coupled to a ground reference. A second terminal of inductor is coupled node $V_{OUT}$ 507 and a first terminal of capacitor 506. In various embodiments, $V_{OUT}$ 507 may correspond to SoC supply 103 as depicted in the embodiment illustrated in FIG. 1. A second terminal of capacitor 506 is coupled to the ground reference.

Figure 6:
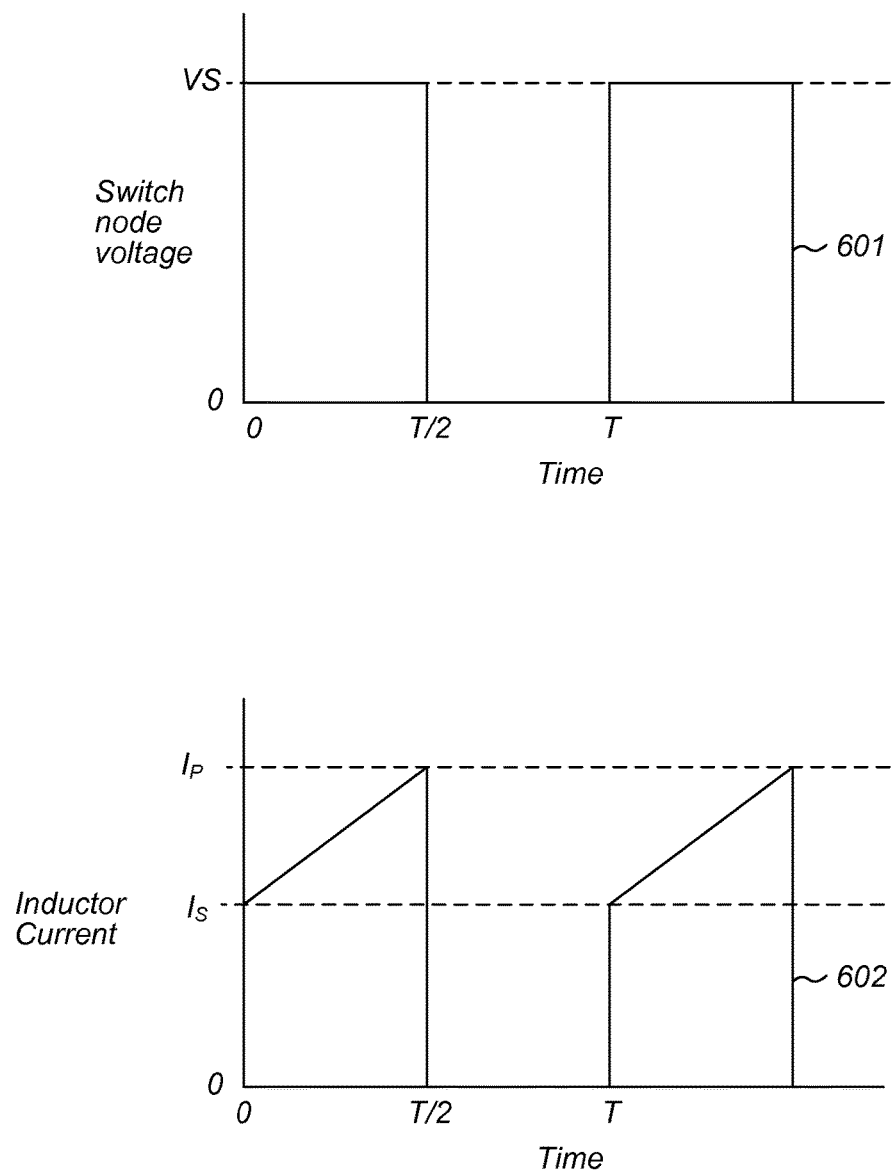
FIG. 6 illustrates example waveforms associated with the operation of a voltage regulator unit.

During operation, switches 502 and 503 close and open to alternatively couple the first terminal of inductor 504 to supply voltage $V_{IN}$ 501 and the ground reference. FIG. 6 illustrates sample waveforms depicting the operation of voltage regulator 500 during a given period of time. It is noted that the waveforms depicted in FIG. 6 are merely examples and that, in other embodiments, the waveforms may have different magnitudes, periods, slopes, etc.

Referring collectively to the FIG. 5 and FIG. 6, at time 0, switch 502 closes. The voltage level on the switch node (node 509) becomes substantially equal to Vsupply (VS) as shown in waveform 601. At this point, inductor current 508 jumps to an initial value $I_s$ (waveform 602). Inductor current 508 continues to rise, reaching a maximum value of $I_p$ (waveform 602) at time T/2. At time T/2, switch 502 may open, and switch 509 may close coupling node 509 to ground. As the voltage on node 509 transitions to ground, Inductor current 508 transitions to zero (waveform 602). The process then repeats beginning at time T.

Based on a number of pulses, as well as the width of the pulses, on a control signal for a voltage regulator, such as, e.g., control signal 410 as illustrated in FIG. 4, the supply voltage and output current of the voltage regulator may be determined. The average current through an output inductor of the voltage regulator, such as, e.g., inductor 407, may be calculated using equation 1.

$$I_{avg} = \frac{1}{T} \int_0^T i(t)\, dt \tag{1}$$

That is, the average current is the integral of a function describing the instantaneous current through the inductor over a single period T. Using a piecewise linear function to represent i(t) as depicted in FIG. 6 (waveform 602), the expression for the average current can be expressed as shown in equation 2, where DT is the time the first terminal of the inductor is coupled to the regulator power supply, $I_S$ is the starting current through the inductor and $I_P$ is the peak current through the inductor. In the example of FIG. 6, DT is equal to T/2.

$$I_{avg} = \frac{1}{T}\int_0^T \left[I_S + \left(\frac{I_P - I_S}{DT}\right)t\right]dt \qquad (2)$$

The integral depicted in equation 2 may be evaluated resulting in equation 3.

$$I_{avg} = I_S\left(1 - \frac{1}{2D}\right) + \frac{I_P}{2D} \qquad (3)$$

An assumption may then be made that both the initial and peak currents are proportional to the supply voltage of the regulator. This may be expressed mathematically in equations 4 and 5, where k and m are constants of proportionality, and $V_S$ is the voltage level of the power supply for the regulator.

$$I_S = kV_S \qquad (4)$$

$$I_P = mV_S \qquad (5)$$

In various embodiments, the proportionality constants, k and m, may be determined during a calibration mode. In such a mode, an external current sensor may be employed, and the starting and peak current through the inductor of the voltage regulator may be determined. An appropriate value for k and m may then be selected. The selected values for k and m may then be stored within the SoC for future use by circuitry 307. In some embodiments, multiple versions of the proportionality constants may be stored for use at different temperatures or other operating conditions.

By substituting equations 4 and 5 into equation 3, an updated expression for the average current, as depicted in equation 6, may be generated.

$$I_{avg} = V_S\left[k\left(\frac{2D - 1 + \frac{m}{k}}{2D}\right)\right] \qquad (6)$$

Using equation 6, it is possible to calculate the average inductor current over a single period by multiplying the value of the voltage level of the regulator power supply by the intermediate value contained within the square brackets. The intermediate value is a function of the proportionality constants m and k, and well as the pulse duration D. In various embodiments, equation 6 may be used by circuit 307, or any other suitable in processing unit, to calculate the average inductor current for a given time period. As indicated by equation 6, the calculation of the average inductor current is not a function of any direct measure of the inductor current, so high power consumption analog measurement circuits do not need to employed, thereby saving power.

Figure 7:
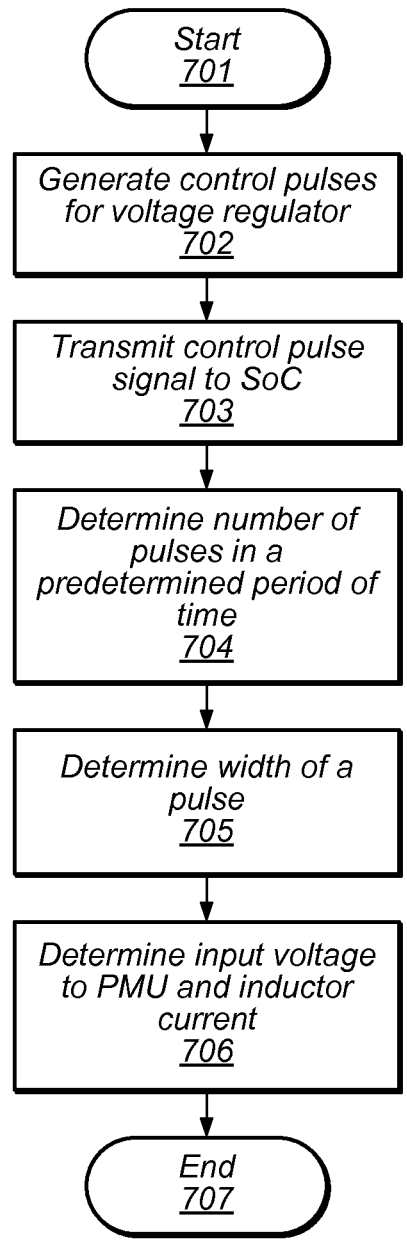
FIG. 7 illustrates a flow diagram depicting an embodiment of a method for measuring regulator current.

Turning to FIG. 7, a flow diagram of an embodiment of a method for measuring current of a voltage regulator, such as, e.g., voltage regulator unit 400 as illustrated in FIG. 4, is depicted. Referring collectively to FIG. 1, FIG. 3, and FIG. 4, the method begins in block 701.

Control pulses on signals 411 and 412 may then be generated in response to changes in a voltage level of supply signal 409 (block 702). In various embodiments, control unit 401 receives information indicative of the voltage level of supply signal 409. The information may then be compared to upper and lower threshold values. Control unit 401 may then generate pulses on either signals 413 or 414 in order to couple the first terminal of the inductor to either the power supply or ground, thereby adjusting the voltage of supply signal 409 to remain between the aforementioned threshold values.

The control pulses on signal 411 may then be inverted and transmitted from PMU 101 to SoC 102 (block 703). Pulse analysis unit 300 may then receive the transmitted control pulses from PMU 101 and determine a number of pulses in a predetermined period of time (block 704). In various embodiments, a counter may increment in response to the detection of each pulse within the predetermined period of time. At the end of the predetermined period of time, the counter may reset in preparation of determining a number of pulses received for a subsequent time period.

Pulse analysis unit 300 may then determine a width of a given control pulse of the transmitted control pulses (block 705). In various embodiments, pulse analysis unit 300 may take multiple samples of a particular pulse received during the predetermined period of time. Based on the multiple samples, pulse analysis unit 300 may generate a digital indicative of a duration of the particular pulse.

An average value of an output current of voltage regulator unit 400 may then be determined (block 706). In various embodiments, circuits 307 may determine an intermediate value dependent upon the duration of the particular pulse and at least one constant of proportionality. The intermediate value may then be multiplied by a voltage level of the switch node 415 to generate the average value of the output current of voltage regulator unit 400. In various embodiments, one or more performance parameters may be adjusted dependent upon the average value of the output current. The method may then conclude in block 507.

It is noted that the operations illustrated in the flowchart of FIG. 7 are depicted as being performed in a sequential fashion. In other embodiments, one or more of the illustrated options may be performed in parallel.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
 a counter unit configured to:
  receive a signal from a Power Management Unit (PMU), wherein the signal includes a plurality of pulses; and
  determine a number of pulses received during a predetermined period of time;
 a pulse sampler unit configured to:
  receive the signal from the PMU; and
  determine a duration of a given pulse of the plurality of pulses; and
 circuitry configured to multiply a value corresponding to a voltage level of a supply voltage from a power supply coupled to the PMU by an intermediate value to determine a value of an average current through an inductor included in the PMU based on the number of pulses and the duration of the given pulse, wherein the intermediate value is based on the duration of the given pulse, and at least one constant.

2. The apparatus of claim 1, wherein the at least one constant includes a constant of proportionality between a first value of current through the inductor and the value corresponding to the voltage level of the supply voltage from the power supply coupled to the PMU.

3. The apparatus of claim 1, wherein the circuitry is further configured to determine a value of the constant during a calibration mode.

4. The apparatus of claim 1, wherein the counter unit includes a plurality of flip-flop circuits, wherein each flip-flop circuit of the plurality of flip-flop circuits is coupled to a clock signal.

5. The apparatus of claim 4, wherein to determine the duration of a given pulse of the plurality of pulses, the pulse sampler unit is configured to sample the given pulse dependent upon the clock signal.

6. A method, comprising:
 generating at least one control signal for a voltage regulator, wherein the at least one control signal includes a plurality of pulses;
 determining a number pulses of the plurality of pulses that occur during a predetermined period of time;
 determining a duration of a given pulse of the plurality of pulses; and
 multiplying a value corresponding to a voltage level of supply voltage from a power supply coupled to the voltage regulator by an intermediate value to determine a value of an average value of an output current of the voltage regulator based on the number of pulses of the plurality of pulses and the duration of the given pulse; wherein the intermediate value is dependent upon the duration of the given pulse, and at least one constant.

7. The method of claim 6, wherein the predetermined period of time is programmable.

8. The method of claim 6, wherein determining the number of pulses of the plurality of pulses includes incrementing a counter in response to detecting a particular pulse of the plurality of pulses.

9. The method of claim 8, further comprising resetting the counter in response to determining the predetermined period of time has elapsed.

10. The method of claim 6, wherein the output current of the voltage regulator flows through an inductor included in the voltage regulator.

11. The method of claim 6, further comprising performing a calibration operation to determine at least one constant of proportionality between a first value of the output current of the voltage regulator and the voltage level of the supply voltage from the power supply coupled to the voltage regulator.

12. A system, comprising:
 a power management unit (PMU) configured to:
  generate a control signal, wherein the control signal includes a plurality of pulses; and
  couple a first terminal of an inductor to a power supply dependent upon the control signal, wherein a second terminal of the inductor is coupled to an output terminal of the PMU; and
 a first integrated circuit that includes a power supply terminal coupled to the output terminal of the PMU, wherein the first integrated circuit is configured to:
  receive the control signal from the PMU;
  determine a number of pulses received during a predetermined period of time;
  determine a duration of a given pulse of the number of pulses received during the predetermined period of time; and
  multiply a value corresponding to a voltage level of a supply voltage from the power supply by an intermediate value to determine a value of an average current through the inductor based on the number of pulses and the duration of the given pulse, wherein the intermediate value is based on the duration of the given pulse, and at least one constant.

13. The system of claim 12, wherein the first integrated circuit is further configured to determine voltage level of the supply voltage from the power supply coupled to the PMU based on the number of pulses and the duration of the given pulse.

14. The system of claim 12, wherein to determine the number of pulses received during the predetermined period of time, the first integrated circuit is further configured to increment a counter in response to detecting a particular pulse of the plurality of pulses received during the predetermined period of time.

15. The system of claim 14, wherein the first integrated circuit is further configured to reset the counter in response to a determination that the predetermined period of time has elapsed.

16. The system of claim 14, wherein the counter includes a plurality of flip-flop circuits, wherein each flip-flop circuit of the plurality of flip-flop circuits is coupled to a clock signal included in the first integrated circuit.

17. The system of claim 12, wherein the predetermined period of time is programmable.

18. The system of claim 12, wherein the first integrated circuit is further configured to adjust at least one performance parameter dependent upon the value of the average current through the inductor.

* * * * *